US010008256B1

(12) United States Patent
Kim

(10) Patent No.: US 10,008,256 B1
(45) Date of Patent: Jun. 26, 2018

(54) SUB WORD LINE DRIVER OF SEMICONDUCTOR MEMORY DEVICE

(71) Applicant: SK hynix Inc., Icheon-si, Gyeonggi-do (KR)

(72) Inventor: Young Min Kim, Icheon-si, Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/691,945

(22) Filed: Aug. 31, 2017

(30) Foreign Application Priority Data

Dec. 27, 2016 (KR) ........................ 10-2016-0179757

(51) Int. Cl.
| | | |
|---|---|---|
| *G11C 16/04* | (2006.01) | |
| *G11C 11/408* | (2006.01) | |
| *G11C 8/08* | (2006.01) | |
| *G11C 8/14* | (2006.01) | |
| *G11C 29/02* | (2006.01) | |

(52) U.S. Cl.
CPC ............ *G11C 11/4085* (2013.01); *G11C 8/08* (2013.01); *G11C 8/14* (2013.01); *G11C 29/025* (2013.01)

(58) Field of Classification Search
CPC ....... G11C 16/04; G11C 11/4085; G11C 8/08; G11C 8/14; G11C 29/025
USPC .................................................... 365/185.23
See application file for complete search history.

(56) References Cited

U.S. PATENT DOCUMENTS

| | | | | |
|---|---|---|---|---|
| 7,564,134 B2* | 7/2009 | Yang | ...................... | G11C 5/063 257/758 |
| 2006/0098469 A1* | 5/2006 | Yang | ...................... | G11C 5/063 365/63 |
| 2009/0001482 A1 | 1/2009 | Kang | | |
| 2009/0262564 A1* | 10/2009 | Yang | ...................... | G11C 5/063 365/51 |
| 2012/0264274 A1 | 10/2012 | Kang | | |
| 2015/0380416 A1 | 12/2015 | Saino | | |

FOREIGN PATENT DOCUMENTS

KR   1020090000869   1/2009

* cited by examiner

*Primary Examiner* — Harry W Byrne
(74) *Attorney, Agent, or Firm* — William Park & Associates Ltd.

(57) ABSTRACT

A layout structure of a sub word line of a semiconductor memory device is disclosed. A sub word line driver of a semiconductor memory device includes: a plurality of first active regions arranged in a line shape in a first direction; a plurality of second active regions spaced apart from the plurality of first active regions a predetermined distance in a second direction, and arranged in a line shape in the first direction; a first main word line disposed over the first active regions, and formed in a diagonal direction in the first active regions; a second main word line disposed over the second active regions, and formed in a diagonal direction in the second active regions; and a pickup active region disposed between the first main word line and the second main word line.

15 Claims, 4 Drawing Sheets

SUB WORD LINE DRIVER OF SEMICONDUCTOR MEMORY DEVICE

CROSS-REFERENCE TO RELATED APPLICATION

The present application claims priority under 35 U.S.C. § 119(a) to Korean patent application No. 10-2016-0179757 filed on Dec. 27, 2016, the disclosure of which is hereby incorporated by reference in its entirety.

BACKGROUND OF THE INVENTION

1. Technical Field

Embodiments of the present disclosure relate to a sub word line driver of a semiconductor memory device, and more particularly to a layout of forming a well pickup in a PMOS region of a sub word line driver.

2. Related Art

Generally, a semiconductor memory device includes a plurality of memory cells and a circuit for controlling the memory cells.

FIG. 1 is a conceptual diagram illustrating an arrangement structure of cell mats MATs for use in a general semiconductor memory device.

Referring to FIG. 1, the semiconductor memory device includes a plurality of mats MATs, each of which includes array-shaped memory cells for storing data. Each mat MAT may include a bit-line sense amplifier BLSA arranged in a row direction to sense/amplify cell data, and a plurality of sub word line drivers SWDs arranged in a column direction to enable sub word lines coupled to gates of cell transistors.

In this case, the respective sub word line drivers SWDs may operate word lines WLs of the right and left cell mats MATs.

FIG. 2 is a circuit diagram illustrating a general sub word line driver.

Referring to FIG. 2, the sub word line driver may be formed in a sub word line driver array shape which respectively outputs the sub word line drive signals SWL0 □ SWL3 and SWL4 □ SWL7 in response to main word line drive signals MWLB0 and MWLB1 and word line selection signals FX0, FX2, FX4, and FX6. In this case, the respective sub word line drivers may have the same structure in the remaining parts other than input/output (I/O) signals.

Representatively, the structure of the respective sub word line drivers will hereinafter be described using a sub word line driver of a first stage.

Each sub word line driver may include a PMOS transistor P11 and NMOS transistors N11 and N12. The PMOS transistor P11 and the NMOS transistor N11 may be coupled in series between an input terminal of a word line selection signal FX0 and an input terminal of a back-bias voltage VBBW (or ground voltage VSS), and may receive a main word line drive signal MWLB0 through a common gate terminal. The NMOS transistor N12 may be coupled in series between an output terminal of a sub word line drive signal SWL0 and the back-bias voltage VBBW (or ground voltage VSS) input terminal, and may receive an inversion signal FXB0 of the word line selection signal FX0 through a gate terminal thereof.

In the above-mentioned structure, a regional gain gradually increases in proportion to the increasing size of the sub word line driver, such that a minimum-sized sub word line driver must be arranged in the semiconductor memory device.

However, the conventional art has difficulty in forming a well pickup active region in a PMOS region while simultaneously reducing the region of a sub word line driver, such that the conventional art unavoidably shares well pickup active regions of the other regions.

BRIEF SUMMARY OF THE INVENTION

Various embodiments of the present disclosure are directed to providing a sub word line driver of a semiconductor memory device that substantially obviates one or more problems due to limitations and disadvantages of the related art.

An embodiment of the present disclosure relates to a sub word line driver for preventing an increase of the region of a sub word line driver by improving a structure of a sub word line, resulting in formation of a well pickup active region in a PMOS region.

In accordance with an aspect of the present disclosure, a sub word line driver of a semiconductor memory device includes: a plurality of first active regions arranged in a line shape in a first direction; a plurality of second active regions spaced apart from the plurality of first active regions a predetermined distance in a second direction, and arranged in a line shape in the first direction; a first main word line disposed over the first active regions, and formed in a diagonal direction in the first active regions; a second main word line disposed over the second active regions, and formed in a diagonal direction in the second active regions; and a pickup active region disposed between the first main word line and the second main word line.

In accordance with another aspect of the present disclosure, a sub word line driver of a semiconductor memory device includes: a first transistor including a first gate located in a first active region and first contacts disposed at both sides of the first gate; a second transistor including a second gate located in a second active region adjacent to the first active region in a first direction, and second contacts located at both sides of the second gate; a third transistor including a third gate located in a third active region adjacent to the first active region in a second direction, and third contacts located at both sides of the third gate; a fourth transistor including a fourth gate located in a fourth active region adjacent to the third active region in the first direction, and fourth contacts located at both sides of the fourth gate; and a pickup active region disposed among the first to fourth active regions.

It is to be understood that both the foregoing general description and the following detailed description of embodiments are exemplary and explanatory.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 3:
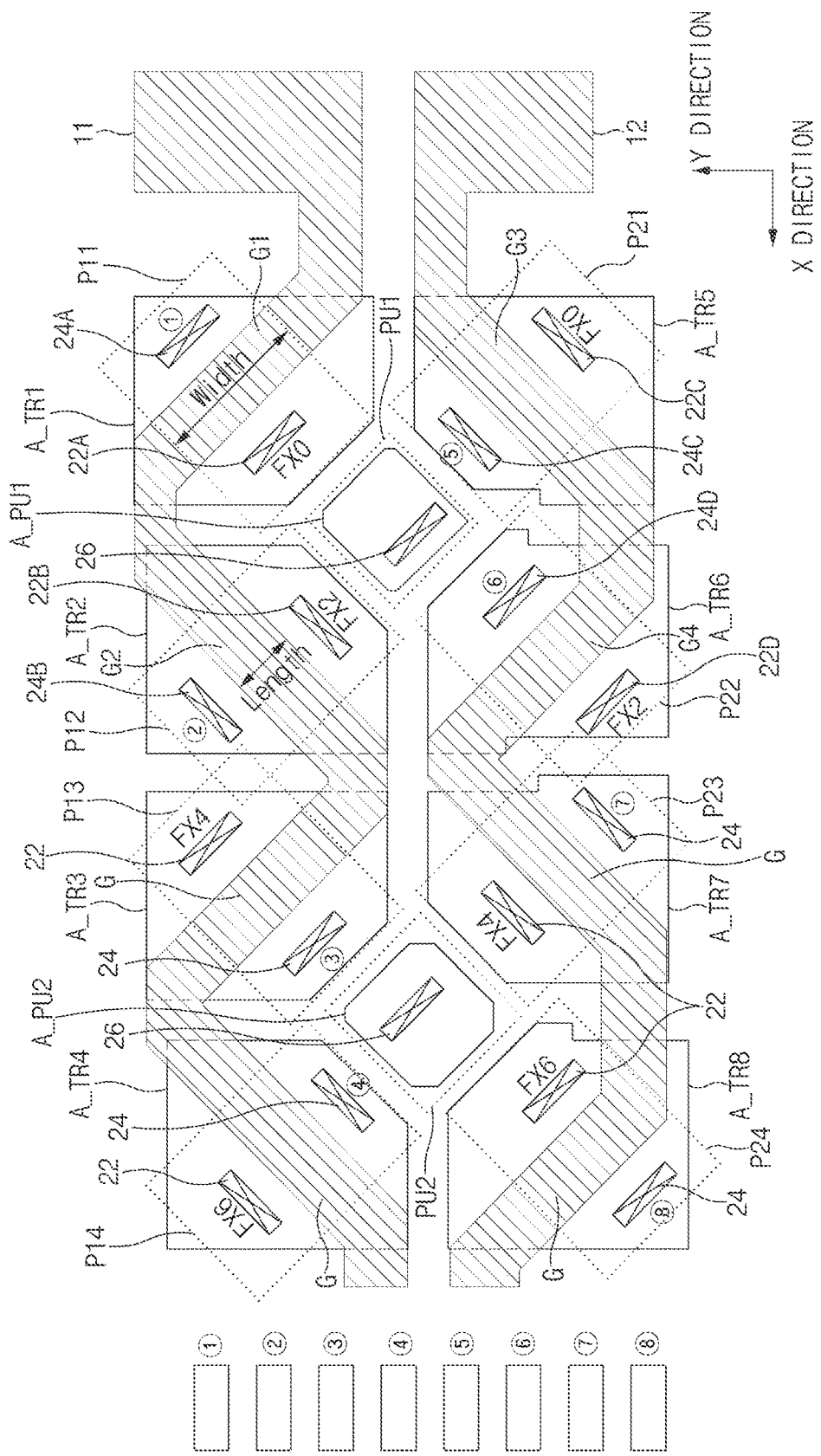
FIG. 3 is a structural diagram illustrating a layout structure of a PMOS region in the sub word line driver according to an embodiment of the present disclosure.

FIG. 3 is a structural diagram illustrating a layout structure of a PMOS region of a sub word line driver according to an embodiment of the present disclosure.

Referring to FIG. 3, a PMOS region of the sub word line driver includes a plurality of active regions A_TR1 □ A_TR8 in which transistors P11 □ P24 are formed, and a plurality of pickup active regions A_PU1 and A_PU2 in which pickup regions PU1 and PU2 are formed.

The active regions A_TR1 □ A_TR4 (for example, first group of active regions) may be spaced apart from each other a predetermined distance in a first direction (X direction). The active regions A_TR5 □ A_TR8 (for example, second group of active regions) may also be spaced apart from each other a predetermined distance in the first direction, and may be spaced apart from the active regions A_TR1 □ A_TR4 a predetermined distance in a second direction (Y direction).

The pickup active regions A_PU1 and A_PU2 may be used as pickup regions for applying a bulk bias to an N well in which PMOS transistors P11 □ P24 are formed, in a word line driver, and the pickup active regions A_PU1 and A_PU2 may be coupled to a contact 26 for receiving a back-bias voltage VBBW or a ground voltage. The pickup active regions A_PU1 and A_PU2 may be spaced apart from each other a predetermined distance in the first direction, and may be enclosed by the active regions A_TR1 □ A_TR8. For example, the pickup active region A_PU1 may be formed in a diamond (or lozenge) shape, and may be enclosed by four active regions A_TR1, A_TR2, A_TR5, and A_TR6. In addition, the pickup active region A_PU2 may also be formed in a diamond shape, and may be enclosed by four active regions A_TR3, A_TR4, A_TR7, and A_TR8.

Figure 1:
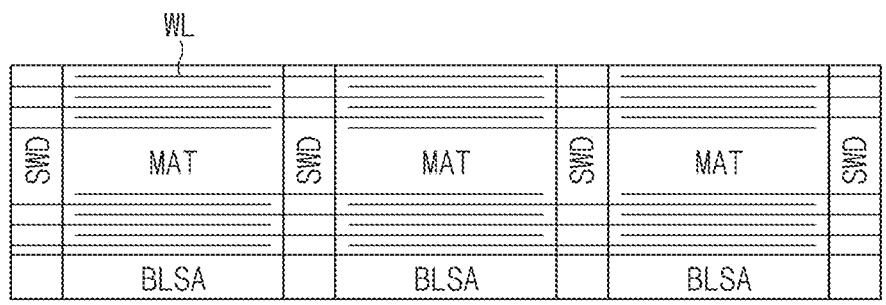
FIG. 1 is a conceptual diagram illustrating a prior art arrangement structure of cell mats MATs for use in a general semiconductor memory device.
Figure 2:
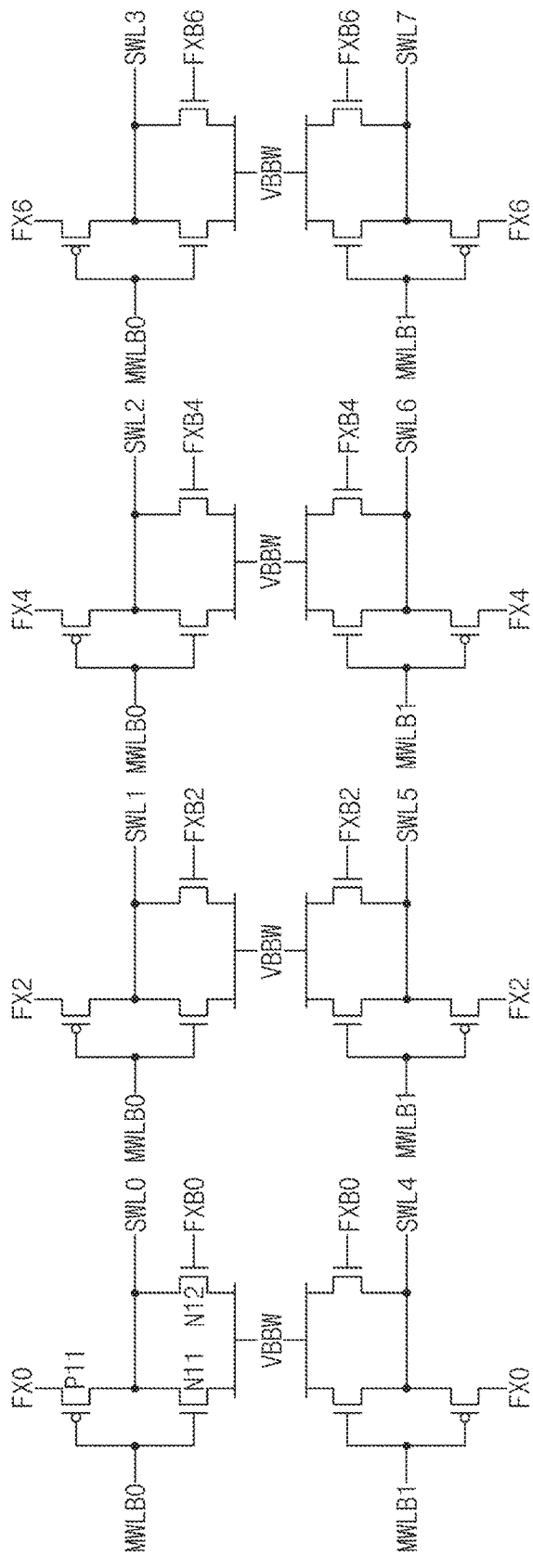
FIG. 2 is a conceptual diagram illustrating prior art sub word lines SWLs arranged in the cell mats MATs.

A main word line 11 may be disposed over the active regions A_TR1~A_TR4, and a main word line 12 may be disposed over the active regions A_TR5~A_TR8. In the main word lines 11 and 12, the parts formed to overlap the active regions A_TR1~A_TR8 may be used as gates G, or G1~G4 for receiving main word line drive signals MWLB0 and MWLB1 illustrated in the sub word line driver of FIG. 2. The gates designated by G include all gates including gates G1~G4.

Specifically, the parts (i.e., the gates of the respective PMOS transistors P11~P24) formed to overlap the active regions A_TR1~A_TR8 in the main word lines 11 and 12 may be formed in a line shape extending in a diagonal direction with respect to the first direction and the second direction (Y direction). In this case, the gates G of the PMOS transistors P11~P14 and P21~P24 located adjacent to each other in the first direction may be formed to cross each other if the gates G were extended. In more detail, the main word lines 11 and 12 may extend in a diagonal direction in the active regions A_TR1 □ A_TR8, and may be formed in a zigzag pattern in such a manner so that oblique directions of the main word lines 11 and 12 may be formed to cross each other in the active regions adjacent to the first direction. Moreover, the main word lines 11 and 12 may be formed to be symmetrical to each other based around the X-axis. Although the respective PMOS transistors P11~P24 of FIG. 3 which are denoted by dotted lines for convenience of description and better understanding of the present disclosure, regions of the PMOS transistors P11~P24 are not limited thereto.

As described above, the main word lines 11 and 12 are formed to extend in symmetrical diagonal directions in the respective active regions A_TR1~A_TR8, such that a space between the main word lines 11 and 12 in which the pickup regions PU1 and PU2 can be formed may be guaranteed. For example, in association with not only two adjacent active regions (A_TR1 and A_TR2, A_TR3 and A_TR4) in which the main word line 11 is formed, but also two adjacent active regions (A_TR5 and A_TR6, A_TR7 and A_TR8) in which the main word line 12 is formed, the pickup active regions A_PU1 and A_PU2 for forming the pickup regions PU1 and PU2 may be formed between every two adjacent active regions. In one example, the pickup active region A_PU1 is disposed between a first active region A_TR1 and a sixth active region A_TR6 and a second active region A_TR2 and a fifth active region A_TR5.

In addition, gates G of the respective PMOS transistors P11 □ P24 are formed in a diagonal direction, such that the length of each gate G can be more freely elongated or shortened and the width of each transistor can be more freely enlarged as compared to the other case in which each gate G is formed in a horizontal or vertical direction.

In the respective active regions A_TR1 □ A_TR8, metal contacts 22 for receiving main word line selection signals FX0, FX2, FX4, and FX6 and other metal contacts 24 coupled to sub word lines ①~⑧ may be respectively located at both sides of the main word lines 11 and 12.

In this case, a diagonal direction of the metal contacts 22 and 24 is parallel to the main word line located in the same active region A_TR1~A_TR8 as the contacts 22 and 24, such that the metal contacts 22 and 24 may be formed in a substantially rectangular shape (or, alternatively an oval shape) and may be spaced a same distance apart from each other at both sides of the main word lines 11 and 12 in the same active region A_TR1~A_TR8. Reference to the contacts 22 and 24 includes contacts 22A~22D and contacts 24A~24D.

In the respective PMOS transistors P11~P24, gates G are formed in a direction diagonal to the first direction and the second direction, metal contacts 22 and 24 formed at both sides of the gates G are formed in a substantially rectangular shape parallel to the gates G, such that the metal contacts 22 and 24 located at both sides of the gates G may be spaced apart from the gates G by a same distance. For example, a first transistor P11 may include a first gate G1 located in the first active region A_TR1 and first contacts 22A and 24A may be disposed at both sides of the first gate G1. A second transistor P12 may include a second gate G2 located in the second active region A_TR2 adjacent to the first active region A_TR1 in the first direction, and second contacts 22B and 24B located at both sides of the second gate G2. A third transistor P21 may include a third gate G3 located in a third active region A_TR5 adjacent to the first active region A_TR1 in the second direction, and third contacts 22C and 24C located at both sides of the third of the third gate G3.

And, a fourth transistor P22 may include a fourth gate G4 located in a fourth active region A_TR6 adjacent to the third active region A_TR5 in the first direction, and fourth contacts 22D and 24D located at both sides of the fourth gate G4. As described above, the metal contacts 22 and 24 are spaced apart from the gates G by the same distance, such that the respective transistors P11~P24 may have the same operating characteristics.

Figure 4:
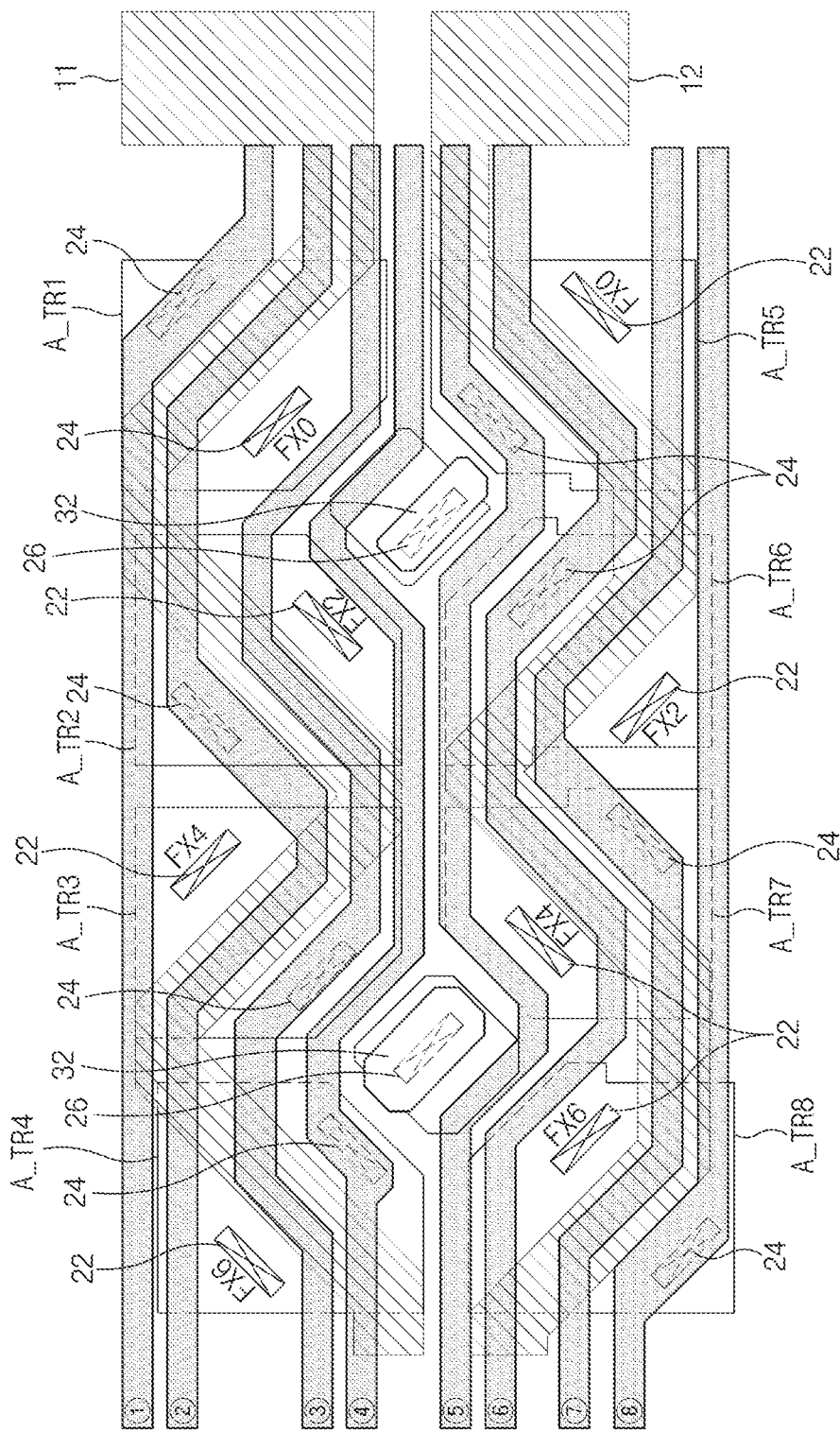
FIG. 4 is a structural diagram illustrating not only the layout structure of FIG. 3, but also sub word lines and metal pads coupled to a pickup contact.

FIG. 4 is a structural diagram illustrating not only the layout structure of FIG. 3, but also sub word lines and metal pads 32 coupled to a pickup contact 26.

Referring to FIG. 4, the sub word lines ①~⑧ may be coupled to the active regions A_TR1~A_TR8 through the metal contacts 24, and may be coupled to word lines of each mat (MAT) in which memory cells are formed. The sub word lines □ □ □ may be formed as metal lines M0 disposed over the main word lines 11 and 12.

Moreover, the sub word lines □ □ □ may be formed to extend in the diagonal direction at upper portions of the pickup regions PU1 and PU2 in the same manner as in the main word lines 11 and 12, such that a space in which the metal pad 32 coupled to the contact 26 can be formed is guaranteed at an upper portion of the contact 26 of the pickup regions PU1 and PU2.

As is apparent from the above description, the embodiments of the present disclosure can form a well pickup active region in a PMOS region of the sub word line driver without increasing the region of the sub word line driver.

Embodiments of the present disclosure can have a same distance between a gate and a contact of transistors in a PMOS region of the sub word line driver, such that the corresponding transistors can have the same operation characteristics.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor is the embodiment limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A sub word line driver of a semiconductor memory device comprising:
    a plurality of first active regions arranged in a line shape in a first direction;
    a plurality of second active regions spaced apart from the plurality of first active regions a predetermined distance in a second direction, and arranged in a line shape in the first direction;
    a first main word line disposed over the first active regions, and formed in a diagonal direction in the first active regions;
    a second main word line disposed over the second active regions, and formed in a diagonal direction in the second active regions; and
    a pickup active region disposed between the first main word line and the second main word line.

2. The sub word line driver according to claim 1, wherein the first main word line is formed to have a zigzag pattern formed in a crossing direction within adjacent active regions.

3. The sub word line driver according to claim 2, wherein the second main word line is formed to have a zigzag pattern formed symmetrical to the first main word line.

4. The sub word line driver according to claim 1, wherein the pickup active region is disposed between two adjacent active regions from among the first active regions and between two adjacent active regions from among the second active regions.

5. The sub word line driver according to claim 1, further comprising:
    contacts arranged at both sides of the first main word line and the second main word line in the first active regions and the second active regions.

6. The sub word line driver according to claim 5, wherein the contacts include:
    a first contact configured to receive a word line selection signal; and
    a second contact coupled to sub word lines.

7. The sub word line driver according to claim 5, wherein the contacts are arranged in a diagonal direction parallel to a main word line located in the same active region.

8. The sub word line driver according to claim 7, wherein the contacts are spaced a same distance apart from a main word line located in the same active region.

9. The sub word line driver according to claim 5, wherein the contacts are formed to have a substantially rectangular or oval shape parallel to the first main word line and the second main word line.

10. A sub word line driver of a semiconductor memory device comprising:
    a first transistor including a first gate located in a first active region and first contacts disposed at both sides of the first gate;
    a second transistor including a second gate located in a second active region adjacent to the first active region in a first direction, and second contacts located at both sides of the second gate;
    a third transistor including a third gate located in a third active region adjacent to the first active region in a second direction, and third contacts located at both sides of the third gate;
    a fourth transistor including a fourth gate located in a fourth active region adjacent to the third active region in the first direction, and fourth contacts located at both sides of the fourth gate; and
    a pickup active region disposed among the first to fourth active regions.

11. The sub word line driver according to claim 10, wherein the first to fourth gates are formed to extend in a direction diagonal to the first direction and the second direction.

12. The sub word line driver according to claim 11, wherein each of the first to fourth contacts is formed in a substantially rectangular or oval shape in a manner such that longitudinal directions of the first to fourth contacts are parallel to the first to fourth gates.

13. The sub word line driver according to claim 12, wherein the first to fourth contacts are respectively spaced apart from the first to fourth gates by a same distance.

14. The sub word line driver according to claim 10, wherein the pickup active region is disposed between the first active region and the fourth active region and between the second active region and the third active region.

15. The sub word line driver according to claim 10, wherein the first to fourth transistors are PMOS transistors.

* * * * *